United States Patent [19]

Adair, Jr.

[11] Patent Number: 5,519,388
[45] Date of Patent: May 21, 1996

[54] METHOD AND APPARATUS FOR ACTIVE TEMPERATURE COMPENSATION IN A RADIOWAVE TRANSMITTER

[75] Inventor: Henry H. Adair, Jr., Duluth, Ga.

[73] Assignee: Schlumberger Industries, Inc., Norcross, Ga.

[21] Appl. No.: 425,540

[22] Filed: Apr. 20, 1995

[51] Int. Cl.$^6$ .................................................. G08B 23/00
[52] U.S. Cl. ........................ 340/870.02; 340/870.17; 340/870.05; 340/870.04; 455/71; 455/113
[58] Field of Search .................... 340/870.02, 870.03, 340/870.04, 870.05, 870.16, 870.17; 455/67.1, 69, 70, 71, 75, 113, 115, 125; 374/163, 170, 183, 184

[56] References Cited

U.S. PATENT DOCUMENTS

| | | | |
|---|---|---|---|
| 3,805,256 | 4/1974 | Pepin | 340/870.17 |
| 4,395,776 | 7/1983 | Naito et al. | 455/113 |
| 4,614,945 | 9/1986 | Brunius et al. | 340/870.03 |
| 5,208,835 | 5/1993 | Weeks et al. | 455/71 |

Primary Examiner—Brent A. Swarthout
Assistant Examiner—Andrew Hill
Attorney, Agent, or Firm—Keith G. W. Smith

[57] ABSTRACT

A method and apparatus for producing a temperature stabilized frequency from a signal generator in a monitoring station is described. The signal generator monitors the voltage response of an RC circuit where the resistive portion is formed by a thermistor, to produce a time-dependent signal. A comparator compares the time-dependent signal to a reference voltage to determine a rise time of the voltage across the capacitor. Based upon a software timer loop, the signal generator determines a temperature range by selecting data from a look-up table based upon the rise time of the RC circuit.

20 Claims, 6 Drawing Sheets

METHOD AND APPARATUS FOR ACTIVE TEMPERATURE COMPENSATION IN A RADIOWAVE TRANSMITTER

TECHNICAL FIELD

The present invention relates to a method and apparatus for producing a temperature stabilized output frequency in a transmitter.

BACKGROUND OF THE INVENTION

Several approaches to remotely collecting data from meter reading monitoring stations, such as those for gas and electric power meters, have been proposed.

In one system described in U.S. Pat. No. 4,614,945 to Brunius et al., multiple, battery-powered monitoring stations, such as gas meter monitors, are located throughout an area and each of the monitoring stations includes a transponder (referred to by Brunius as an Encoder/Receiver/ Transmitter unit "ERT")) for transmitting radiowave signals corresponding to data collected by the monitoring station. A mobile data collection unit collects data by traveling through the area, activating the ERTs to transmit their radiowave signals and receiving and decoding the radiowave signals to identify the data. To activate the ERTs, the mobile unit includes a transmitter that emits a "wake-up" or "interrogation" signal. All ERTs within range of the mobile unit, upon receiving the interrogation signal, respond by transmitting their accumulated data by transmitting their identification codes and accumulated data a plurality of times by means of serially spaced bursts.

At times, the mobile unit may be within range of several ERTs simultaneously and, because the mobile unit does not uniquely poll the individual transponders, it may energize all ERTs within range of the wake-up signal simultaneously. Because more than one ERT may begin transmission at the same time, their signals may "collide" at the mobile unit. That is, radiowave signals from several of the transponders may arrive at the mobile unit together, such that the receiver within the mobile unit receives a combination of the various signals from the transponders. In such a case, the signals may be difficult to detect or may result in an incorrect signal being detected by the receiver.

Brunius treats the problem of signal collision by having the time interval between successive transmission bursts be determined as a function of the identification code of the transponder unit such that, with each transponder being assigned an identification code differing from other transponders in the area, the temporal spacing between bursts will differ between transponders. Nevertheless, the initial bursts may occur at the same time.

Brunius also varies transponder frequency to address the problem of collisions. Each transponder, upon receiving the wake-up signal, begins transmission at a preset transmission frequency and successive transmissions by the transponder are shifted to different frequencies. The frequency shift of successive transmissions is dependent upon the time interval, and thus the unit identification number.

Brunius does not teach a method of varying the frequency of the initial bursts. Instead, Brunius relies upon "tuning variances" to give differing initial frequencies of transmission. Because the Brunius system requires transmission and reception of wake up signal, it requires the mobile unit to include both a receiver and a transmitter and also requires the monitoring station to include a transponder to both transmit and receive data. Thus, though data transfer is unidirectional (from the monitor to the receiver) both the monitor and the receiver require transponders.

Because the Brunius units are battery powered, the units remain inactive in the absence of the "wake-up" signal to conserve power. Even though this intermittent activity may conserve some power, the batteries within the units still must be replaced eventually. Often, such replacement of the batteries requires removal of the monitoring meter. Governmental regulations require meters to be recalibrated whenever they are removed, so battery replacement typically involves returning the meter to a repair facility for recalibration.

An additional problem that must be addressed in remote data collection systems is confinement of transmission with specified frequency limits. The amount of allowable frequency variation is limited by various factors. For example, the available frequency band is prescribed by governmental regulation and depends upon the characteristics of the transmitters and receivers.

It is therefore necessary to control the output frequency of the transmitters within the system such that transmissions are limited to a predetermined frequency range. While the frequency range may be defined somewhat by the design of the system, tight control of the output frequency is often difficult without complex systems, such as those using precision components or feedback configurations.

Moreover, because the monitors may operate over a wide range of operating environments, including wide temperature variations, component values may vary. Consequently, the output frequencies may drift outside of the design limits as the operating temperature changes.

If the system were operated at a single frequency, consequences of temperature-induced frequency shift could be reduced using conventional techniques, such as simple feedback. However, where multiple frequencies are used, conventional approaches become increasingly complex and expensive.

SUMMARY OF THE INVENTION

A monitoring station for monitoring the power usage of a facility includes a power monitor, such as a power meter, producing power usage data and a transmitter. The transmitter includes an oscillator that produces an output signal at an output frequency corresponding to a voltage applied to a control input. The transmitter also includes a timing circuit having a temperature-dependent time constant in thermal contact with the power monitor. The timing circuit is an RC circuit having a resistive portion formed from a thermistor and a capacitive portion across which an output voltage is established. The timing circuit is connected to receive a step voltage from a step generator and to produce the output voltage reaching a reference voltage after a temperature-dependent time period following the leading edge of the step voltage. The temperature-dependent time period is determined by the time constant of the RC circuit.

The transmitter also includes a timer connected to receive the output voltage from the timing circuit and determine the time period by measuring the elapsed time between the leading edge of the step voltage and the time when the output voltage reaches a reference voltage. A first memory within the transmitter has a plurality of locations containing respective data sequences for determining the control voltage. A controller within the transmitter is connected to retrieve a selected one of the data sequences from the first memory in response to the timer and to produce a digital signal in response to the retrieved data sequence. A voltage generator within the transmitter receives the digital signal from the controller and produces an output voltage corresponding to the digital signal. The output voltage is used as a fine adjust voltage to control the output frequency of the oscillator. The controller also establishes a coarse adjustment voltage for input to the oscillator in response to data retrieved from a second memory within the transmitter. The controller supplies the coarse adjust voltage to the transmitter in conjunction with the fine adjust voltage to control the output frequency. To transmit data the transmitter combines the output signal and the power usage data to form a radiowave signal and transmits the radiowave signal with an antenna.

The controller selects fine adjust data from the first memory in response to random numbers retrieved from a third memory within the transmitter. Also, in response to random number data retrieved from the third memory, the controller establishes random intervals between bursts of data.

In a method according to the invention, the monitoring station monitors the power usage of a facility and produces monitoring data corresponding to the power usage. The timer measures the rise time of the timing circuit and compares the rise time of the timing circuit to a reference voltage to determine when the output voltage of the timing circuit reaches the reference voltage. The timer measures the rise time by counting the number of loops in a fixed duration program loop. The monitoring station then retrieves the data sequence from a memory location determined in response to the determined time difference and produces an RF signal at an output frequency by producing a control voltage in response to the retrieved data sequence and applying the control voltage to a control input of a voltage controlled oscillator. The RF signal is then combined with the monitor data to produce an output signal and the output signal is transmitted with an antenna. To produce the control voltage, the transmitter determines a coarse sequence in response to a first portion of the retrieved data sequence and determines an address in a fine adjust memory in response to a second portion of the retrieved data sequence. The transmitter then produces a coarse adjust voltage in response to the coarse sequence and a fine adjust control voltage in response to the fine adjust sequence.

DETAILED DESCRIPTION OF THE INVENTION

Figure 1:
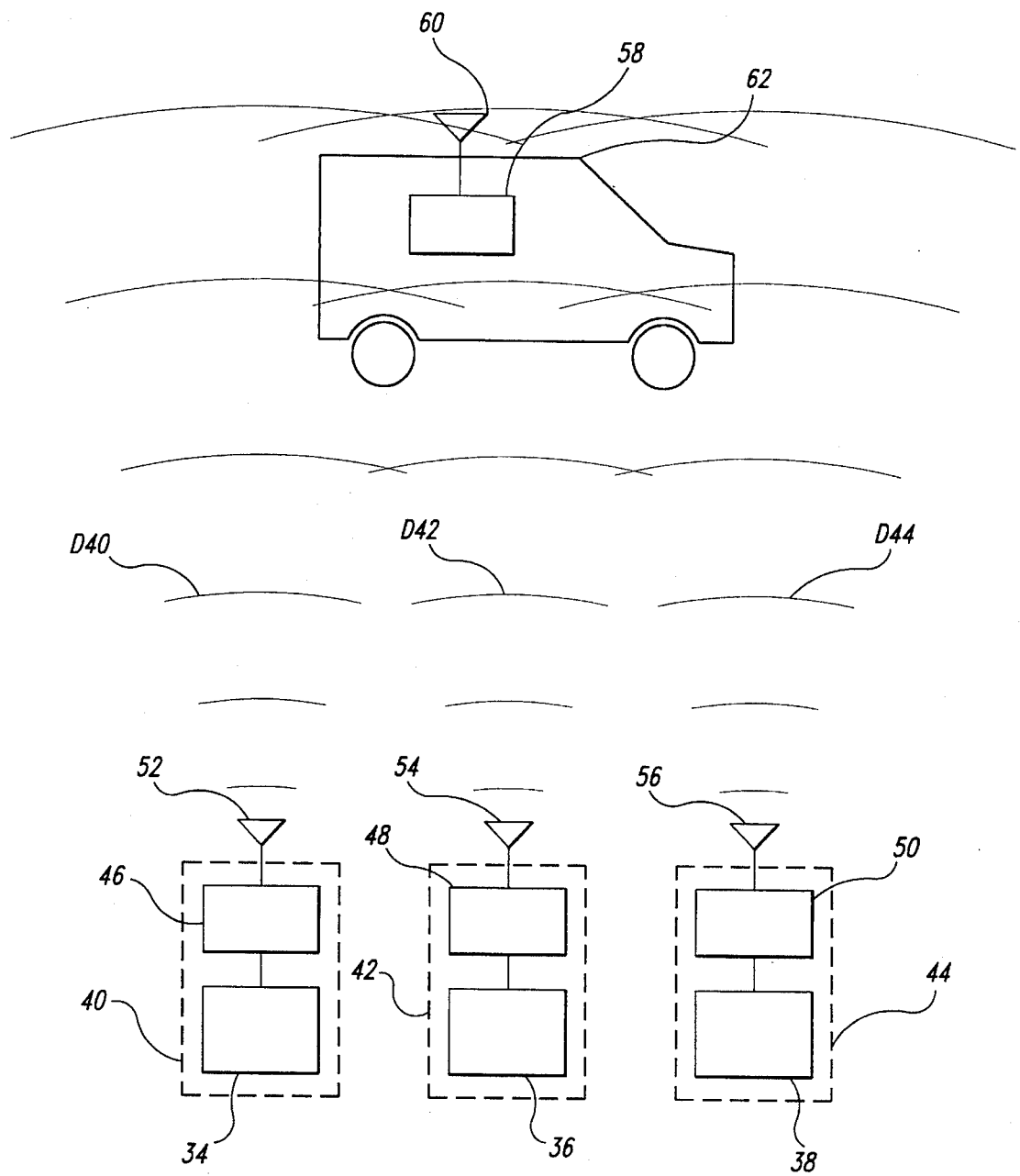
FIG. 1 is a representational view of a system according to the invention including three monitoring stations and a mobile receiver.

As shown in FIG. 1, three monitoring stations 40, 42, 44 are spaced apart in a data collection area. The monitoring stations 40, 42, 44 are data gathering stations including power monitors 34, 36, 38 such as power meters used in typical residences or other facilities to monitor electrical power usage. Because the monitoring stations 40, 42, 44 are used primarily for monitoring power, they are equipped to draw power from the electrical line serving the facility eliminating the need for battery-powered operation and eliminating the need for battery replacement. While only three monitoring stations 40, 42, 44 are shown for clarity of presentation, it will be understood that the number of stations may be significantly higher.

Each of the monitoring stations 40, 42, 44 includes a respective transmitter 46, 48, 50 transmitting radiowave signals D40, D42, D44 with a respective microstrip antenna 52, 54, 56 within the transmitter. Because the monitoring stations 40, 42, 44 do not operate on battery power, they are not strictly limited by power use constraints and can operate continuously without need for a "wake-up" signal. The radiowave signals D40, D42, D44 consist of finite duration "bursts" emitted by the antennas 52, 54, 56. Each of the bursts is formed by an antenna driver 65 within the oscillator by modulating a carrier signal at a respective output frequency $f_{out}$ with a digital sequence representing data collected by the monitors 34, 36, 38 using On-Off keying. Each digital sequence includes a first portion representing the monitored information, a second portion representing the identification number of the unit and a third portion representing other information, such as the unit type and tamper information. The transmission of each burst is repeated several times to form a group with each burst in the group being separated from the preceding burst by a selected time period and each group being separated by a selected interval.

The groups of bursts are received by a mobile receiver 58 having a receiving antenna 60 that is driven past the monitoring stations 40, 42, 44 in a van 62. Upon receiving the group, the receiver 58 decodes them to obtain their digital sequences. The receiver 58 then stores the data for later communication to a central system which uses the data to calculate power usage, generate power bills, and identify meter tampering.

As represented by the intersecting signals D40, D42, D44 in FIG. 1, the receiving antenna 60 may be simultaneously within range of more than one of the signals D40, D42, D44. If no action is taken to prevent the signals D40, D42, D44 from "colliding," the signals D40, D42, D44 may arrive simultaneously at the receiver 58, interfering with each other and causing data loss or miscommunication. To minimize such collisions, the intervals between the groups of bursts and the output frequencies $f_{out}$ of each of the signals D40, D42, D44 are varied randomly, as discussed below with respect to FIG. 2. This reduces the possibility that any two signals will arrive with the same frequency and at the same time to the receiver 58, thereby minimizing the risk of data collision at the receiver.

While the output frequency $f_{out}$ of each of the transmitters 46, 48, 50 may be varied, the frequency range over which the transmitters may transmit is limited between a maximum frequency $f_{max}$ and a minimum frequency $f_{min}$. The maximum frequency $f_{max}$ and minimum frequency $f_{min}$ may be established by operational parameters of the receiver 58 or by governmental regulation. The transmitters 46, 48, 50 must therefore limit their respective output frequencies $f_{out}$ to the allowed frequency range.

Figure 2:
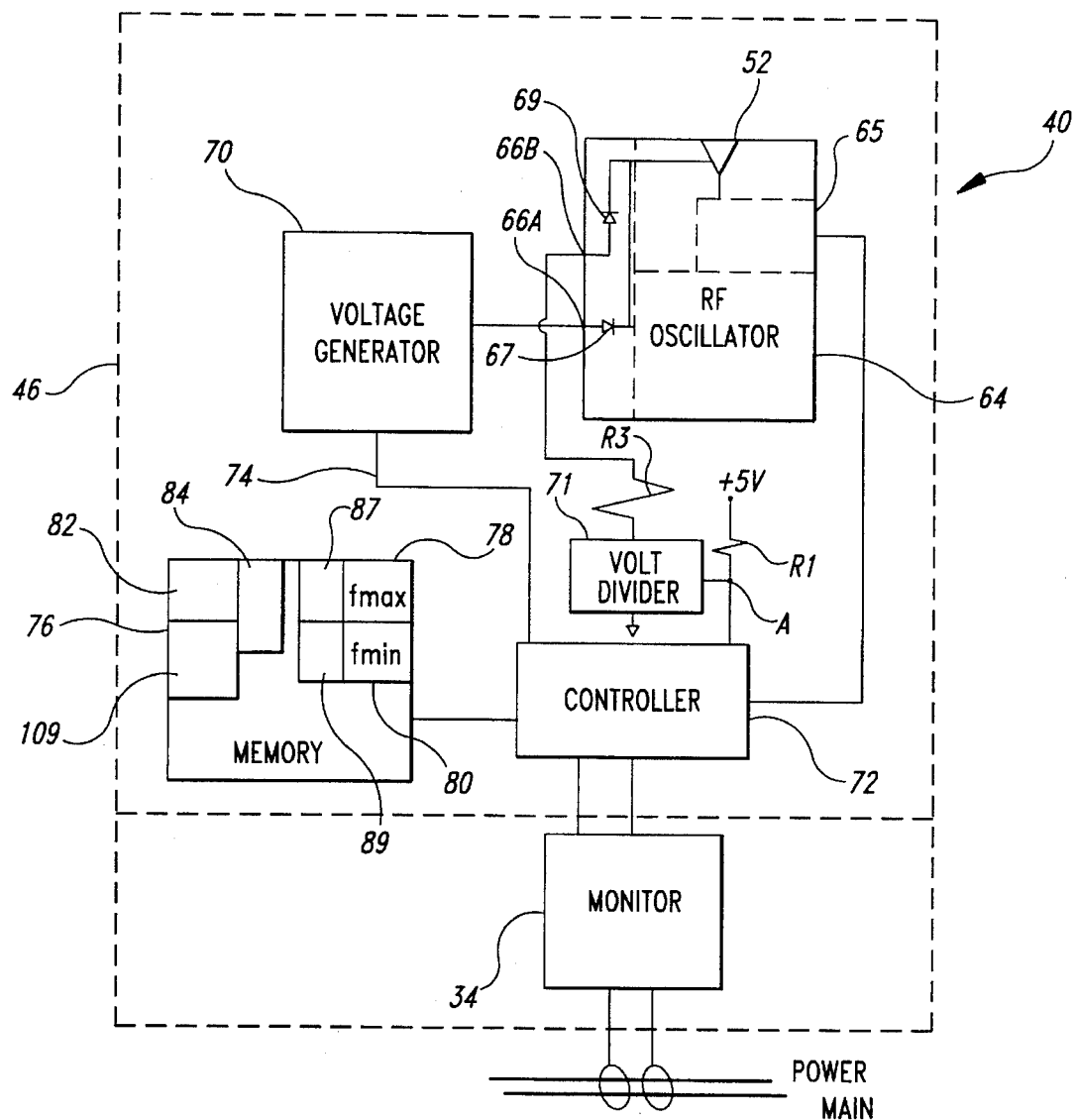
FIG. 2 is a block diagram of a monitoring station including a transmitter according to the invention.

Variation of output frequencies is best explained using the block diagram structure of the monitoring station 40 as presented in FIG. 2. Operation of the monitoring station 40 and interface between the transmitter 46 and monitor 34 is controlled by an integrated controller 72. The controller 72 may be a microprocessor or may be implemented with another integrated device, such as a microcontroller.

Within the transmitter 46 is a voltage controlled oscillator 64 that produces a radiowave signal at a frequency $f_{out}$ to drive the antenna 52 through an antenna driver 65. The oscillator's output frequency $f_{out}$ is determined upon the voltage levels of control voltages applied to a pair of control inputs 66A, 66B. RF oscillators producing output frequencies dependent upon input control voltages are known. Such RF oscillators typically use the capacitance of a varactor within a reactive circuit to establish an output frequency. By varying the voltage applied to the varactor, the capacitance of the varactor is altered, changing the output frequency of the oscillator.

In the embodiment shown in FIG. 2, the oscillator 64 has two control inputs, a fine control 66A and a coarse control 66B to allow an increased range of frequency control. This dual control is realized using two varactors, a fine adjust varactor 67 and a coarse adjust varactor 69. The coarse adjust varactor 69 receives three control voltage levels to place the output frequency $f_{out}$ in one of three ranges, low, medium, and high. The fine adjust varactor 67 receives a fine adjust voltage to set the output frequency $f_{out}$ to selected frequencies within the range established by the coarse adjust varactor 67.

The coarse adjust varactor 69 is referenced to 5 volts by connection to the microstrip antenna 52 which is biased at 5 volts. The controller 72 then establishes the three coarse voltages for the coarse adjust varactor 69 with a logic output referenced to 5 volts by a pull-up resistor R1 through a node A. A voltage divider 71 is connected between the node A, ground and an isolation resistor R3. The isolation resistor R3 delivers the coarse adjust control voltage from the voltage divider to the coarse control 66B.

The three voltage levels depend upon the logic level of the logic output, the voltage divider 71, and the value of the resistors R1, R2. To select one of the three levels, the controller 72 sets the logic output to a high, open, or low state. When the logic output is set to high, the voltage at the node A is established at 5 volts, causing 0.5 volts to be applied across the varactor diode 69 through the isolation resistor R3. When the logic output is set to open, the voltage at the node A is established by the resistor divider formed by the pull-up resistor R1 and the voltage divider 71. This voltage is reduced by the voltage divider 71 and is applied through the isolation resistor to the varactor diode 69. When the controller output is set to low, the controller 72 pulls the voltage at the node A down and the voltage across the varactor diode is approximately 5.0 volts.

The fine control voltage is supplied by a voltage generator 70 in response to a digital data sequence provided by the controller 72 to the voltage generator 70 along a data bus 74. A 6-bit data sequence is used so that the voltage generator 70 may be realized using a 6-bit D/A converter. The controller 72 can therefore select the output frequency $f_{out}$ by setting the coarse adjust voltage to selected frequency range, and supplying a 6-bit data sequence to the voltage generator 70.

The data sequence provided by the controller 72 to the voltage generator 70 is determined in response to data retrieved from a memory 76. The memory 76 includes several memory portions containing control data for operating the monitoring station 40. The structure of the memory 76 and selection of the data is discussed in greater detail below with respect to FIG. 3.

Figure 7:
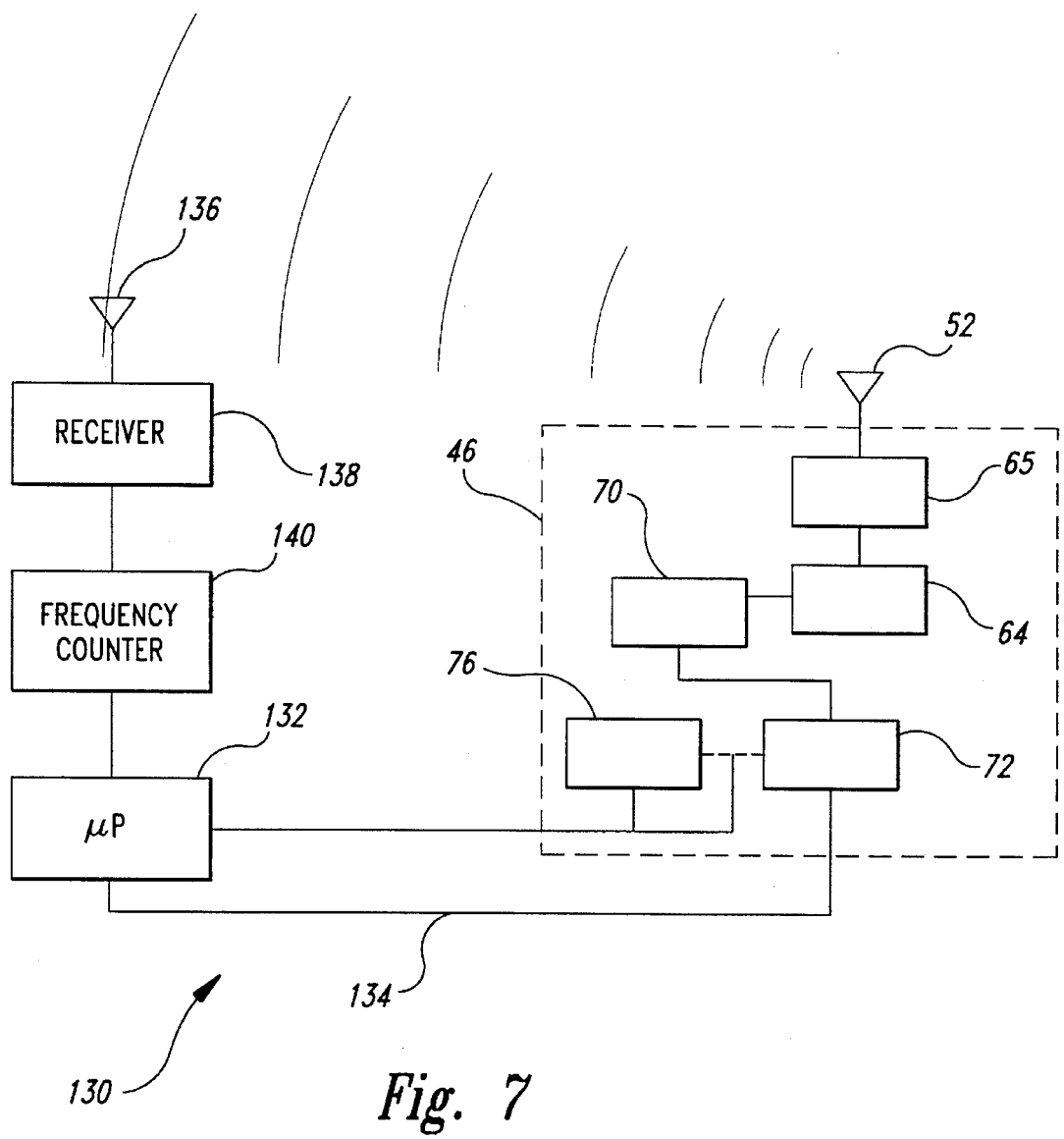
FIG. 7 is a block diagram of a tuning station and monitoring station.

Because the output frequency $f_{out}$ depends upon the control voltages, the maximum and minimum frequencies $f_{max}$, $f_{min}$ for each coarse voltage correspond to a minimum fine control voltage $v_{min}$ and maximum fine control voltage $v_{ma}$, respectively. The minimum and maximum fine control voltages in turn correspond to minimum and maximum values of the 6-bit data sequences retrieved from the memory 76. Because the electrical characteristics of each of the components within the monitoring stations 40, 42, 44 may vary from station to station, the 6-bit data sequences corresponding to the maximum frequency $f_{max}$ and the minimum frequency $f_{min}$ may vary from unit to unit. Therefore, each unit must be tuned to identify the 6-bit data sequences corresponding to the maximum frequency $f_{max}$ and the minimum frequency $f_{min}$. The 6-bit data sequences for room temperature (25° C.) are identified using a tuning station which includes antenna 136, receiver 138, frequency counter 140 and microprocessor 132, as presented in FIG. 7 and are stored in corresponding limit memory locations 78, 80 in the memory 76 along with an additional 2-bit sequence representing the coarse adjust setting (low, medium, high) at 25° C.

In addition to varying from unit to unit, the data sequences corresponding to the minimum and maximum frequencies $f_{min}$, $f_{max}$, vary according to temperature, as determined by the temperature-dependent electrical characteristics of the components. To accommodate the varying limits, an action table 82 is used to compensate the fine adjust limits by providing a link to a fine adjust table 84 which contains pairs of secondary limits each corresponding to specified frequency ranges.

Figure 3:
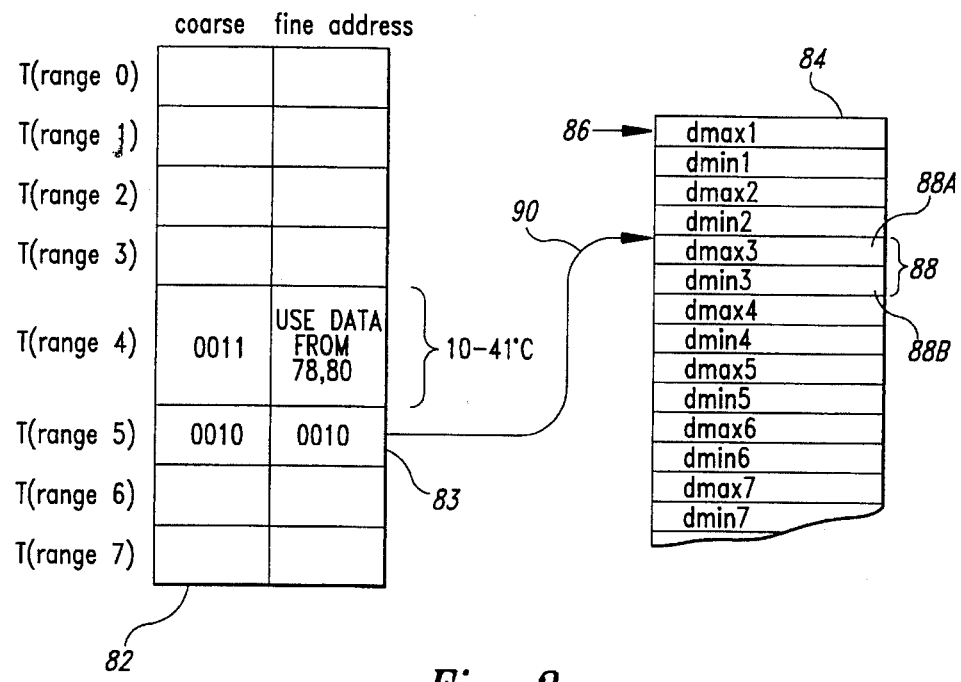
FIG. 3 is a diagram of a data structure showing an action table and a fine adjust table.

The data structure used to store the 2-bit coarse adjustment settings and the 6-bit data sequences for fine adjustment is presented in FIG. 3. The data is stored in two parts, a first part stored in the action table 82 and a second part stored in the fine adjust table 84. To allow data in the tables to be updated, the portion of the memory 76 in which the data is stored is an erasable read only memory, such an EEPROM. The action table 82 has eight memory locations, each corresponding to a discrete temperature range T0–T7 and each containing an 8-bit byte. An example of an 8-bit byte is given by the sequence 00100010 in location 83 corresponding to temperature range T5. As represented by the divider line in the action table 82, each of the 8-bit bytes is broken into two 4-bit subsequences or nibbles.

The first 4-bit nibble determines the coarse adjust voltage. As discussed above, the coarse adjust voltage is limited to three possibilities (low, medium, and high). Therefore, only the two least significant bits of the coarse adjust 4-bit nibble are required to select the coarse adjust voltage. The remaining 2-bits are reserved for later development of the system. A "01" sequence represents a low range of the coarse adjust (i.e., the node A of FIG. 2 is pulled down to a zero level). Similarly, a 10 or 11 sequence represents tuning to the medium level and a 00 sequence represents tuning to a high level.

The second 4-bit nibbles of the 8-bit bytes in the action memory 82 represent pointers relative to a starting address of the fine adjust table 84. The fine adjust table 84 contains 32 bytes grouped in pairs, with each pair of bytes containing a pair of data sequences representing the maximum and minimum 6-bit data sequences for the frequency range. If the temperature is within the 10°–41° C. range, the maximum and minimum values are set to hexadecimal "FF," representing an invalid fine adjust setting. The microprocessor 72 responds to the invalid data by retrieving the fine adjust data directly from the memory 76. The byte containing the maximum data sequence is selected by identifying the starting address 86 of the fine adjust table and adding two times the 4-bit nibble to the starting address 86. The byte containing the minimum data sequence is the immediately next byte in the fine adjust table 84.

Figure 6:
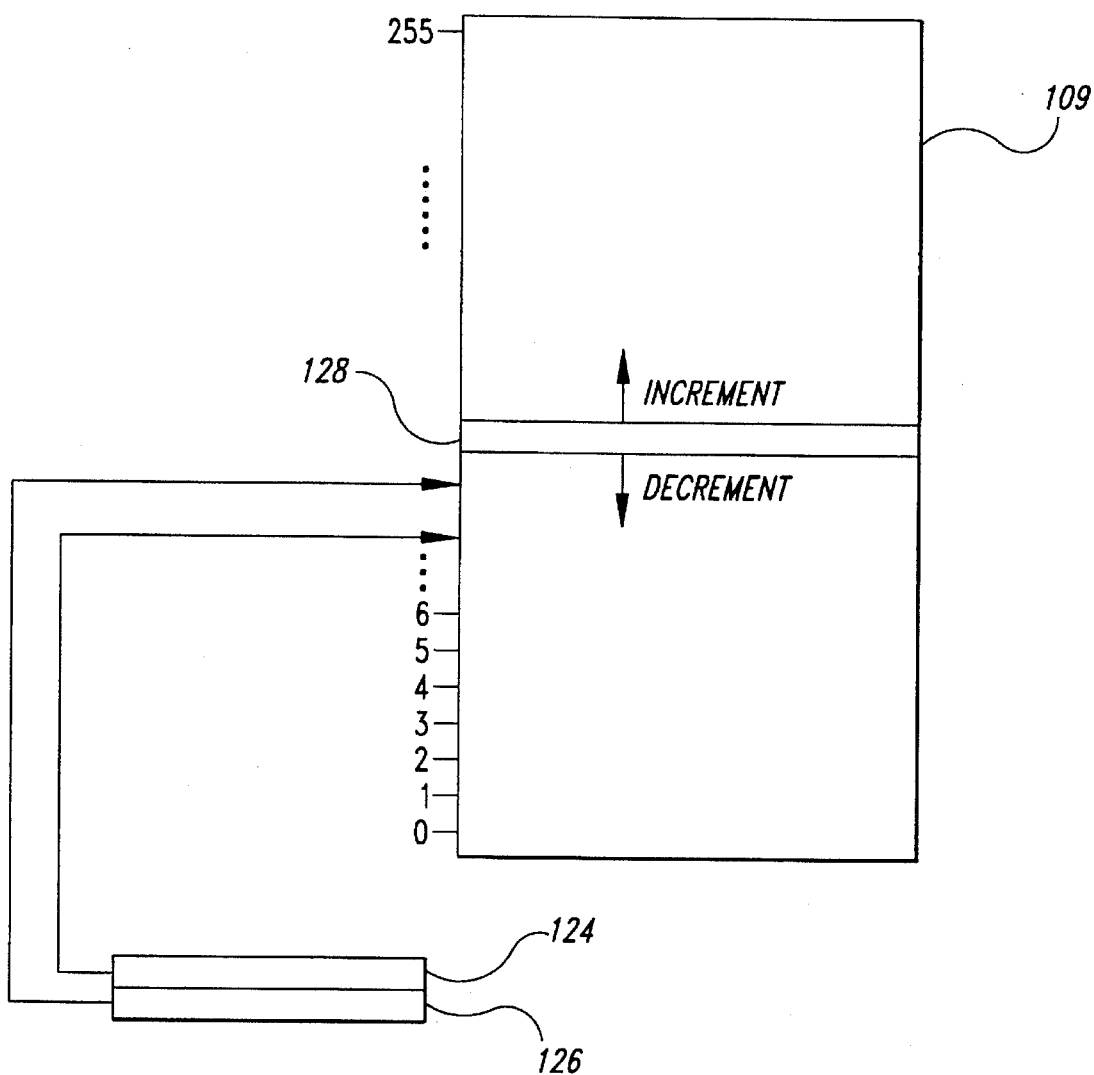
FIG. 6 is a block diagram representing a random number table and address pointers.

For example, for the 8-bit data sequence in the memory location 83, the 4-bit nibble 0010 represents a binary 2. This indicates that the third pair (00 is a valid count representing the first byte) of bytes 88 in the fine adjust table 84 will be used. The address of the first 6-bit data sequence in the third pair of bytes 88 is the starting address 86 plus two times the binary sequence 0010 (or the starting address plus 4) as indicated by the pointer arrow 90 in FIG. 3. If the data retrieved from the fine adjust table 84 is a hexadecimal FF, the microprocessor 72 recognizes the data as invalid and retrieves the fine adjust data directly from the memory 76. As discussed above, once the maximum and minimum data sequences are retrieved from the fine adjust table 84 (or the values from the memory 76), they are used to establish allowable data sequences to be applied to the voltage generator 70 to produce the fine adjust control voltage at the input 66A of the RF oscillator. The actual data sequences to be applied to the voltage generator 70 are selected from a random number table 109 presented in FIG. 6 according to the pointer system. The random number table 109 is stored in the memory 76 and includes 256 memory locations with each memory location identified by an 8-bit offset address referenced to the starting address 111 of the random number table 109. For example, if the starting address 111 is 2068, an 8-bit offset address of 0000011 would be the third memory address after 2068 or memory address 2071. Each of the memory locations contains a 6-bit randomly generated number. Together with the coarse adjust voltage applied to the coarse input 66B of the RF oscillator the fine adjust voltage determines the output frequency $f_{out}$ of the RF oscillator.

Figure 4:
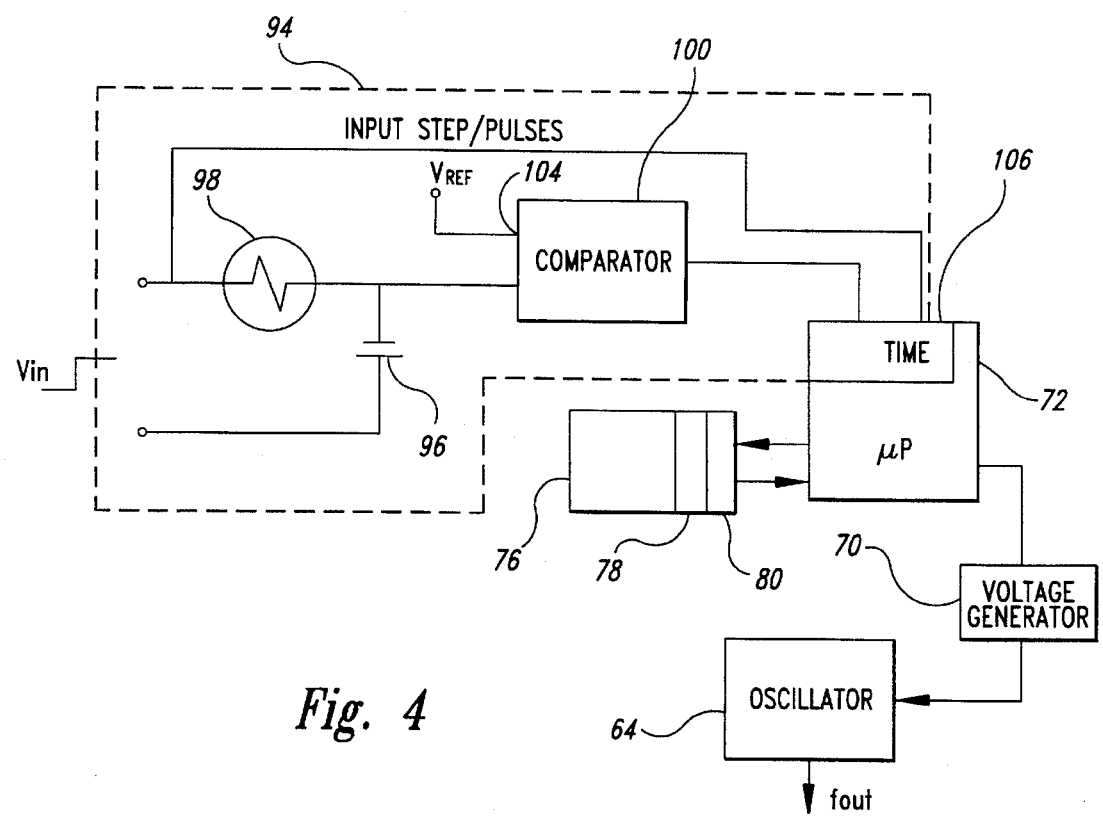
FIG. 4 is a block diagram of an apparatus for temperature compensation, including a temperature sensor circuit.

In order to select the proper 8-bit byte from the action table 82, the monitoring station must first determine the operating temperature range. To determine the operating temperature range, the monitoring station, includes a temperature sensing circuit 94 as shown in FIG. 4. The temperature sensing circuit 94 determines temperature by detecting a temperature-dependent variation in rise time of the voltage across a capacitor 96 in an RC circuit. To make the rise time of the capacitor voltage temperature dependent, the resistive component of the RC circuit is realized with a thermistor 98 in thermal contact with the transmitter 46. Thus, as the temperature of the transmitter 46 varies, the resistive component of the RC circuit varies accordingly. As is known, for a step voltage input the rise time of the voltage across the capacitor 96 depends upon the impedance of the thermistor 98. Thus, the time it takes for the capacitor voltage to reach a selected reference voltage will correspond to the temperature of the transmitter 46.

To determine when the voltage across the capacitor 96 reaches the reference voltage, the capacitor voltage is applied to one input 102 of a comparator 100 and the reference voltage is applied to the second input 104. The comparator 100 produces an output signal when the capacitor voltage reaches the reference voltage. The output signal from the comparator 100 is input to a first input of a timer 106 and the step voltage is applied to a second input of the timer. The timer 106 can thus measure the time difference between the leading edge of the step input voltage and the time when the capacitor voltage reaches the reference voltage, giving a measurement of the rise time of the capacitor voltage.

While the timer 106 could be realized with a conventional component, the timer in the preferred embodiment is realized using a timed program loop in the controller 72 to reduce the number of components. The timed program loop is a software loop in the controller 72 having a fixed duration. The controller 72 determines the rise time by counting the number of times the loop is performed while the capacitor voltage rises to the reference voltage.

Because the number of program loops is temperature dependent, the action table 82 of FIG. 3 is established with each memory location in the action table corresponding to a range of loop counts. The controller 72 then identifies the location in the action table 82 by counting the number of loops and comparing the number of loops to the numbers corresponding to each of the memory locations in the action table. For example, at a temperature of 25° C., the thermistor value, capacitor value, and loop time may be chosen to allow the program loop to complete 12 loops before the capacitor voltage reaches the reference voltage. The temperature range T4 would then be assigned values between 9 and 16 program loops. If the program completed 17 program loops, the controller 72 would retrieve data from temperature range T5 which corresponds to 17–32 program loops.

Figure 5:
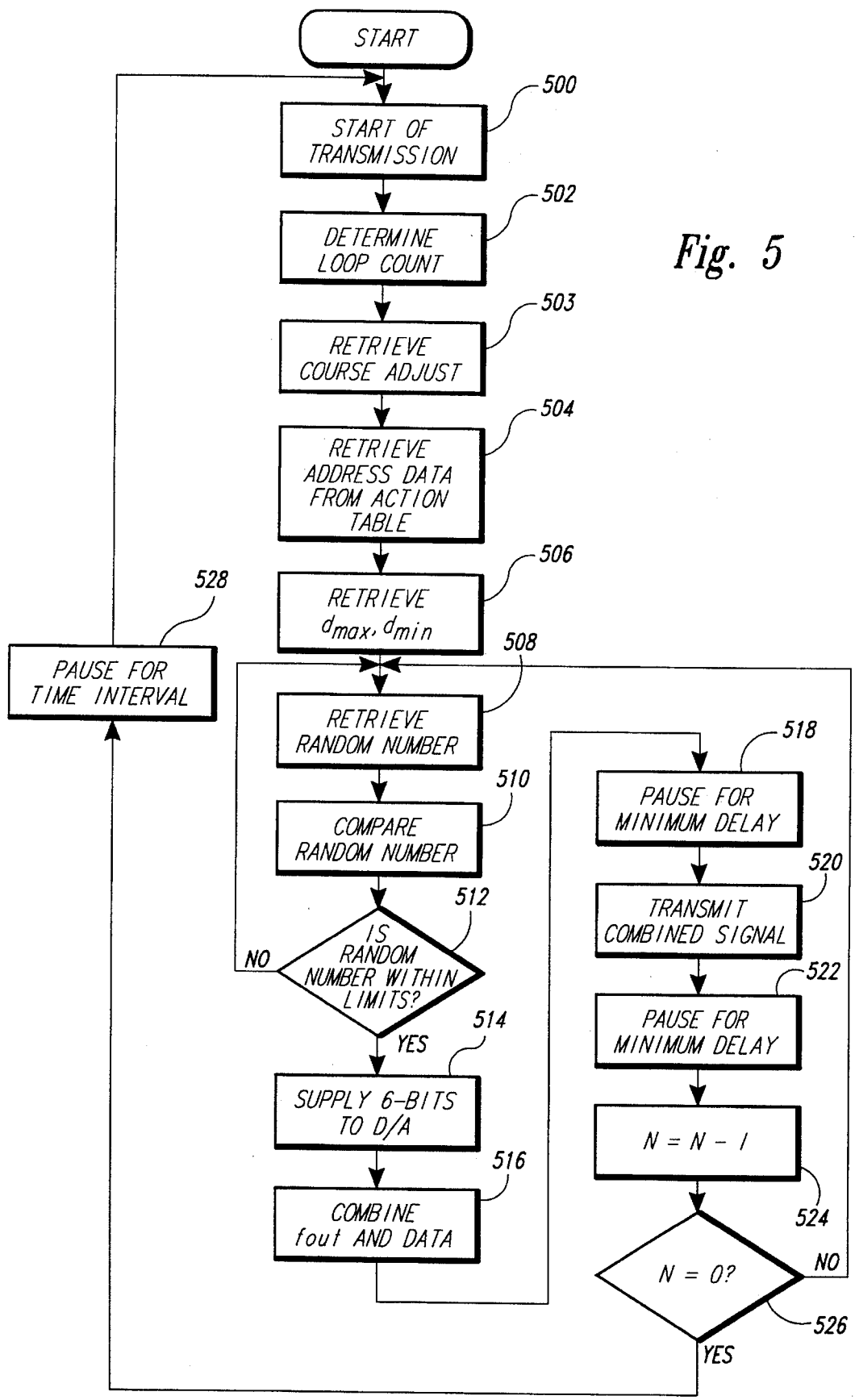
FIG. 5 is a flow chart showing the steps for frequency selection and transmission.

The process of selecting the output frequency and transmitting data is presented in flow diagram form in FIG. 5. The controller 72 initiates transmission of data by producing a Start of Transmission signal as shown in block 500. In response to the Start of Transmission signal the controller 72 applies the step voltage to the RC circuit and the temperature sensing circuit 94 determines the number of loops completed as the voltage of the capacitor 96 rises to the reference voltage in step 502. In response to the loop count, the controller 72 retrieves the 8-bit byte from the action table 82 in the memory 76.

The controller 72 extracts the 2 coarse select bits from the first 4-bit nibble to establish the coarse adjust voltage in step 503. Then, in step 504, the controller 72 identifies the addresses 88A, 88B in the fine adjust table 84 of the fine adjust data sequences corresponding to the maximum and minimum frequency. In step 506, the controller 72 retrieves the 6-bit fine adjust data sequences from the fine adjust table 84. The controller 72 then, in step 508, selects data from the random number table 109 shown in FIG. 6.

In step 510, after the controller 72 has retrieved the 6-bit random number, the controller 72 compares the random number to the 6-bit data sequences retrieved from the fine adjust table 84 in step 506. If, in step 512, the random number is within the limits specified by the data retrieved in step 506, the controller 72 provides the 6-bit random number to the voltage generator 70 in step 514 and the coarse voltage to the coarse input 66B of the oscillator 64. Alternately, the random number may be used as an address in a look-up table to determine an appropriate 6-bit data sequence for input to the D/A converter. This would be appropriate where desired output frequencies are unevenly spaced or where the response of the oscillator 64 is non-linear.

When the controller 72 provides the 6-bit data sequence, the voltage generator 70 supplies the fine adjust voltage to the fine adjust input 66A and, in response to the fine adjust voltage, the oscillator 64 produces the radiowave signal at the output frequency $f_{out}$ corresponding to the 6-bit data sequence from the random number table 109. The antenna driver 65 modulates the radiowave signal with the data from the monitor 34 in step 516 to form the burst and, in step 518, the transmitter 46 transmits the burst, pause for the minimum time spacing (60 ms), and repeats the steps from step 508 until the burst has been repeated a predetermined number N of times at the frequency of the radiowave signal.

Returning to decision block 512, if the random number is not within the limits, the controller 72 returns to step 508, where it retrieves another random number from the random number table 109. The loop is continued until a valid random number is found. After a valid random number is identified and data is transmitted successfully, the monitor 34 pauses for a random time interval as shown in step 520.

As noted above, the controller 72 retrieves data from the random number table 109 according to a pointer system. That is, the controller 72 includes a frequency pointer counter 124 indicating an address in the random number table 109. The controller 72 also includes an interval pointer counter 126 to allow the controller 72 to independently select random numbers to generate random intervals between bursts.

When the monitoring station 40 is initialized, the frequency pointer counter is initialized to a starting address 128 indicated by the last 8 bits of the 24-bit identification number of the monitoring station. This allows the monitoring station 40 to be initialized to a different output frequency $f_{out}$ than nearby stations. The frequency pointer is incremented or decremented each time data is retrieved from the random number table 109. The incrementing or decrementing of the pointer is controlled by the least significant bit of the unit identification number. If the least significant bit of the unit identification number is a "1," the frequency pointer is incremented. If the least significant bit is a "0," the frequency pointer is decremented.

From the foregoing, it will be appreciated that, although embodiments of the invention have been described for purposes of illustration, various modifications may be made without deviating from the spirit and scope of the invention. Accordingly, the invention is not limited except as by the appended claims.

I claim:

1. A signal generator having a temperature stabilized frequency, comprising:

(a) an oscillator having a first control input, the oscillator producing an output signal at an output frequency, the output frequency of the oscillator corresponding to a voltage applied to the control input;

(b) a step generator producing a step voltage having a leading edge;

(c) a timing circuit having a temperature-dependent time constant, the timing circuit being connected to receive the step voltage from the step generator, the timing circuit producing an output voltage reaching a reference voltage a temperature-dependent time period after the leading edge in response to the step voltage, the time period being determined by the time constant;

(d) a timer connected to receive the step voltage and the output voltage from the timing circuit, the timer determining the time period by measuring the elapsed time between the leading edge and the time when the output voltage reaches a reference voltage, the timer producing a timing signal indicating the time period;

(e) a first memory having a plurality of locations, each location having an address, each location containing a data sequence;

(f) a random number memory containing random number data;

(g) a controller connected to receive the timing signal and to retrieve a selected one of the data sequences from the first memory in response to the timing signal, the controller further being connected to retrieve random number data from the random number table, the controller producing a digital signal in response to the data sequence retrieved from the first memory and the retrieved random number data; and (h) a voltage generator having an output connected to the control input of the oscillator, the voltage generator having a digital input connected to receive the digital signal from the controller, the voltage generator producing at its output the voltage for input to the control input, the voltage corresponding to the digital signal at the digital input.

2. The signal generator of claim 1 wherein the timing circuit comprises an RC circuit and wherein the resistive portion of the RC circuit includes a thermistor.

3. The signal generator of claim 2 wherein the timer further includes a comparator, the comparator connected to compare the output voltage of the RC circuit to the reference voltage.

4. The signal generator of claim 1 wherein the timer includes a program loop having a predetermined duration, wherein the controller initiates the program loop upon receiving the leading edge and the controller is connected to count the number of program loops to measure the elapsed time.

5. The signal generator of claim 1, further including a second memory containing frequency limit data having respective addresses, the frequency limit data representing maximum and minimum allowable frequencies, the addresses of the frequency limit data corresponding to the data sequences in the first memory, wherein the controller is connected to retrieve frequency limit data from the second memory by selecting data sequences from the first memory.

6. The signal generator of claim 5 wherein the controller is connected to compare the random number data to the frequency limit data.

7. The signal generator of claim 5 wherein the first memory further contains coarse adjustment data and the oscillator includes a coarse adjust input, the coarse adjustment data corresponding to selected voltage ranges of a control voltage, wherein the controller is connected to retrieve the coarse adjustment data and to provide the coarse adjustment voltage to the coarse adjust input.

8. The signal generator of claim 6 wherein the controller is connected to compare the random number data to the frequency limit data.

9. The signal generator of claim 6 wherein the second memory is an erasable read only memory and the random number table is a read only memory.

10. A monitoring station for monitoring the power usage of a facility, comprising:

(a) a power monitor producing power usage data;

(b) an oscillator having a first control input, the oscillator producing an output signal at an output frequency, the output frequency of the oscillator corresponding to a voltage applied to the control input;

(c) a step generator producing a step voltage having a leading edge;

(d) a timing circuit having a temperature-dependent time constant in thermal contact with the power monitor, the timing circuit being connected to receive the step voltage from the step generator, the timing circuit producing an output voltage reaching a reference voltage a temperature-dependent time period after the leading edge in response to the step voltage, the time period being determined by an RC time constant;

(e) a timer connected to receive the step voltage and the output voltage from the timing circuit, the timer determining the time period by measuring the elapsed time between the leading edges and the time when the output voltage reaches a reference voltage, the timer producing a timing signal indicating the time period;

(f) a random number memory containing random number data;

(g) a controller connected to receive the timing signal, the controller being connected to retrieve random number data from the random number table, the controller producing a digital signal in response to the random number data;

(h) a voltage generator having its output connected to the control input of the oscillator, the voltage generator having a digital input connected to receive the digital signal from the controller, the voltage generator producing at its output the voltage for input to the control oscillator, the voltage corresponding to the digital signal at the digital input; and (i) an antenna connected to receive the power usage data and the output signal from the oscillator, the antenna emitting a radiowave signal corresponding to the output signal and the power usage data.

11. The monitoring station of claim 10 wherein the timing circuit comprises an RC circuit having a resistive portion and a capacitive portion, wherein the resistive portion of the RC circuit includes a thermistor, and the timer includes a comparator, the comparator connected to compare the voltage across the capacitive portion to a reference voltage.

12. The monitoring station of claim 10, further including a second memory containing coarse adjustment data and address data, wherein the controller is connected to retrieve the coarse adjustment data and to retrieve the address data from the second memory, the controller being connected to produce a coarse adjust voltage in response to the coarse adjustment data for input to the oscillator and the controller being adapted to select random number data in response to the address data.

13. The monitoring station of claim 12, further including a third memory containing limit data, wherein the controller is connected to retrieve limit data from the third memory and to compare the random number data to the limit data.

14. The monitoring station of claim 13 wherein the controller is connected to supply a step control signal to the step generator, the controller supplying the step control signal at an interval determined in response to the random number data retrieved from the third memory.

15. A method of transmitting monitor data at a temperature stabilized output frequency from a transmitter in a monitoring station connected to a facility, comprising the steps of:

(a) monitoring power usage of the facility with the monitoring station;

(b) producing monitor data corresponding to the power usage;

(c) producing with a step generator a step voltage;

(d) applying the step voltage to an RC circuit having a temperature-dependent time constant and a capacitive portion to raise the voltage of the capacitive portion;

(e) comparing the voltage of the capacitive portion to a reference voltage to determine when the voltage of the capacitive portion reaches the reference voltage;

(f) monitoring the voltage of the capacitive portion of the RC circuit to determine a time difference between the time when the step voltage is applied and the time the voltage of the capacitive portion reaches the reference voltage;

(g) retrieving a data sequence from a memory location, the memory location determined in response to the determined time difference;

(h) producing an RF signal at the output frequency, the output frequency being determined in response to the retrieved data sequence;

(i) combining the monitor data and the RF signal to produce an output signal; and (j) transmitting the output signal with an antenna transmitter.

16. The method of claim 15 wherein the step of producing the RF signal comprises the steps of:

producing a control voltage in response to the retrieved data sequence; and applying the control voltage to a control input of a voltage controlled oscillator.

17. The method of claim 16 wherein the step of producing the control voltage comprises the steps of:

determining an address in a random number memory; and producing a fine adjust control voltage in response to the random number.

18. The method of claim 17, further comprising the steps of:

(k) determining an address in a limit table;

(l) retrieving a limit sequence in response to the address; and (m) comparing the random number to the limit sequence to determine if the random number is acceptable or selecting a new random number before producing the fine adjust control voltage if the random number is not acceptable.

19. The method of claim 17 wherein the step of determining an address in the fine adjust memory comprises the steps of:

identifying a starting address in response to the second portion of the retrieved data sequence;

randomly determining an address adjustment; and adjusting the starting address by the address adjustment to produce the address in the fine adjust memory.

20. The method of claim 17, further comprising the steps of:

determining a coarse sequence in response to a second portion of the retrieved data sequence; and producing a coarse adjust control voltage in response to the coarse sequence.

* * * * *